United States Patent
Hall et al.

(10) Patent No.: US 11,867,812 B2
(45) Date of Patent: *Jan. 9, 2024

(54) APPARATUS AND METHODS FOR ALIGNING DEVICES FOR LIDAR SYSTEMS

(71) Applicant: VELODYNE LIDAR USA, INC., San Jose, CA (US)

(72) Inventors: David S. Hall, Oakland, CA (US); Anand Gopalan, Foster City, CA (US); Cristhian Octavio Reyes, San Jose, CA (US); Thomas Richardson Tewell, Austin, TX (US); Mathew Noel Rekow, Santa Cruz, CA (US)

(73) Assignee: Velodyne Lidar USA, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/521,430

(22) Filed: Nov. 8, 2021

(65) Prior Publication Data

US 2022/0057510 A1 Feb. 24, 2022

Related U.S. Application Data

(63) Continuation of application No. 16/881,966, filed on May 22, 2020, now Pat. No. 11,169,267.
(Continued)

(51) Int. Cl.
*H05K 1/14* (2006.01)
*G01S 17/10* (2020.01)
(Continued)

(52) U.S. Cl.
CPC .............. *G01S 17/10* (2013.01); *H01R 12/70* (2013.01); *H05K 1/0274* (2013.01); *H05K 1/14* (2013.01)

(58) Field of Classification Search
CPC ........ H05K 1/14; H05K 3/308; H05K 5/0026; H05K 5/0069; H05K 2201/03;
(Continued)

(56) References Cited

U.S. PATENT DOCUMENTS

| 4,575,167 A | 3/1986 | Minter |
| 5,644,839 A | 7/1997 | Stone |

(Continued)

OTHER PUBLICATIONS

International Search Report and Written Opinion of PCT/US2020/034345 dated Jul. 22, 2020, 14 pages.

*Primary Examiner* — Hoa C Nguyen
(74) *Attorney, Agent, or Firm* — Kilpatrick Townsend & Stockton LLP

(57) ABSTRACT

Apparatus and methods for aligning circuit boards (e.g., for LIDAR systems) are disclosed. According to one embodiment, an electronic device comprises a secondary device and a coupling device coupled to the secondary device. The coupling device comprises a plurality of conductive members, including a first conductive member and a second conductive member. Each of the conductive members comprises a first end configured to electrically and mechanically couple to a primary circuit board and a second end electrically and mechanically coupled to the secondary device. Each of the plurality of conductive members has an attribute adjustable in response to a condition being added to the respective conductive member, and is configured to maintain the adjusted attribute after the condition is removed.

25 Claims, 9 Drawing Sheets

Related U.S. Application Data

(60) Provisional application No. 62/851,447, filed on May 22, 2019.

(51) Int. Cl.
  *H01R 12/70* (2011.01)
  *H05K 1/02* (2006.01)

(58) Field of Classification Search
  CPC ... H05K 2201/0311; H05K 2201/1028; H05K 2201/10287; H05K 2201/10295; H05K 2201/1031
  See application file for complete search history.

(56) References Cited

U.S. PATENT DOCUMENTS

| | | | |
|---|---|---|---|
| 6,017,246 A | | 1/2000 | Hisazumi et al. |
| 6,075,708 A | * | 6/2000 | Nakamura ............. H05K 1/148 361/752 |
| 9,625,645 B2 | * | 4/2017 | Matsui ................... G02B 6/009 |
| 10,295,656 B1 | | 5/2019 | Li et al. |
| 11,169,267 B2 | | 11/2021 | Hall et al. |
| 11,483,938 B2 | * | 10/2022 | Liu ....................... H05K 3/067 |
| 2014/0357105 A1 | | 12/2014 | Wig |
| 2016/0015885 A1 | | 1/2016 | Pananen et al. |
| 2017/0194728 A1 | | 7/2017 | Yang et al. |
| 2017/0195065 A1 | | 7/2017 | Meier et al. |
| 2019/0214756 A1 | | 7/2019 | Tracy et al. |
| 2019/0252810 A1 | * | 8/2019 | Holec .................. H01R 12/721 |
| 2020/0176905 A1 | | 6/2020 | Buck |
| 2020/0379117 A1 | | 12/2020 | Hall et al. |

* cited by examiner

*1100*

```
┌─────────────────────────────────────────────────────┐
│ Couple a first circuit board to one or more         │
│ secondary devices via respective coupling devices   │─ 1105
│ for coarse alignment                                │
└─────────────────────────────────────────────────────┘
                          │
                          ▼
┌─────────────────────────────────────────────────────┐
│ Stack multiple coarsely aligned circuit boards      │─ 1110
│ to form a block                                     │
└─────────────────────────────────────────────────────┘
                          │
                          ▼
┌─────────────────────────────────────────────────────┐
│ Perform fine alignment at a block level             │─ 1115
│ for each secondary device                           │
└─────────────────────────────────────────────────────┘
```

FIG. 11

APPARATUS AND METHODS FOR ALIGNING DEVICES FOR LIDAR SYSTEMS

CROSS-REFERENCE TO RELATED APPLICATION(S)

This application is a continuation of and claims priority to U.S. patent application Ser. No. 16/881,966, titled "Apparatus and Methods for Aligning Devices for LIDAR systems" and filed on May 22, 2020, which claims priority to and benefit of U.S. Provisional Patent Application Ser. No. 62/851,447, titled "Conductive Alignment Element for LIDAR Systems" and filed on May 22, 2019, both of which are incorporated by reference herein in their entirety.

FIELD OF TECHNOLOGY

The present disclosure relates generally to circuit board coupling, and more specifically to a conductive alignment apparatus that enables alignment between an optical transmitter (e.g., a laser) and a corresponding optical receiver (e.g., an optical detector) after each has been mechanically and electrically coupled to a corresponding printed circuit board.

BACKGROUND

Light detection and ranging ("LIDAR") systems measure the attributes of their surrounding environments (e.g., shape of a target, contour of a target, distance to a target, etc.) by illuminating the target with pulsed laser light and measuring the reflected pulses with a sensor. Differences in laser return times and wavelengths can then be used to make digital 3-D representations of a surrounding environment. LIDAR technology may be used in various applications including autonomous vehicles, advanced driver assistance systems, mapping, security, surveying, robotics, geology and soil science, agriculture, and unmanned aerial vehicles, etc. Depending on the application and associated field of view, multiple channel or laser beams may be used to produce images in a desired resolution. A LIDAR system with greater numbers of channels can generate larger numbers of pixels.

In a multi-channel LiDAR device, optical transmitters are paired with optical receivers to form multiple "channels." In operation, each channel's transmitter emits an optical signal (e.g., laser) into the device's environment and detects the portion of the signal that is reflected back to the channel's receiver by the surrounding environment. In this way, each channel provides "point" measurements of the environment, which can be aggregated with the point measurements provided by the other channels to form a "point cloud" of measurements of the environment.

The measurements collected by a LiDAR channel may be used to determine the distance ("range") from the device to the surface in the environment that reflected the channel's transmitted optical signal back to the channel's receiver, as well as the reflectance of that surface. The range to a surface may be determined based on the time of flight of the channel's signal (e.g., the time elapsed from the transmitter's emission of the optical signal to the receiver's reception of the return signal reflected by the surface). The reflectance of a surface may be determined based on the intensity on the return signal, which generally depends not only on the reflectance of the surface but also on the range to the surface, the emitted signal's glancing angle with respect to the surface, the power level of the channel's transmitter, the alignment of the channel's transmitter and receiver, and other factors.

The foregoing examples of the related art and limitations therewith are intended to be illustrative and not exclusive, and are not admitted to be "prior art." Other limitations of the related art will become apparent to those of skill in the art upon a reading of the specification and a study of the drawings.

SUMMARY

Apparatus and methods for aligning circuit boards (e.g., for LIDAR systems) are disclosed. According to one embodiment, an electronic device comprises a secondary device and a coupling device coupled to the secondary device. The coupling device comprises a plurality of conductive members, including at least a first conductive member and a second conductive member. Each of the conductive members comprises a first end configured to electrically and mechanically couple to a primary circuit board and a second end electrically and mechanically coupled to the secondary device. Each of the plurality of conductive members has an attribute adjustable in response to a condition being added to the respective conductive member, and is configured to maintain the adjusted attribute after the condition is removed.

According to another embodiment, a circuit board alignment method comprises coupling a plurality of secondary devices to a primary circuit board via a respective plurality of coupling devices. Each of the coupling devices comprises a respective plurality of conductive members. Coupling the secondary devices to the primary circuit board comprises electrically and mechanically coupling a first end of each of the conductive members to the primary circuit board. A second end of each of the conductive members is electrically and mechanically coupled to the respective secondary device. After coupling the secondary devices to the primary circuit board, each of the secondary devices is aligned with respect to the primary circuit board and with respect to one or more of the secondary devices while maintaining the electrical and mechanical couplings between the primary circuit board and each of the secondary devices. Aligning each of the secondary devices comprises adjusting a position and/or an orientation of each of the secondary devices.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of any of the present inventions. As can be appreciated from foregoing and following description, each and every feature described herein, and each and every combination of two or more such features, is included within the scope of the present disclosure provided that the features included in such a combination are not mutually inconsistent. In addition, any feature or combination of features may be specifically excluded from any embodiment of any of the present inventions.

The foregoing Summary, including the description of some embodiments, motivations therefor, and/or advantages thereof, is intended to assist the reader in understanding the present disclosure, and does not in any way limit the scope of any of the claims.

BRIEF DESCRIPTION OF THE DRAWINGS

The accompanying figures, which are included as part of the present specification, illustrate the presently preferred embodiments and together with the generally description given above and the detailed description of the preferred embodiments given below serve to explain and teach the principles described herein.

FIG. 11 is a flowchart of a process for coupling and aligning multiple secondary devices at a block level, according to one or more embodiments.

Figure 1:
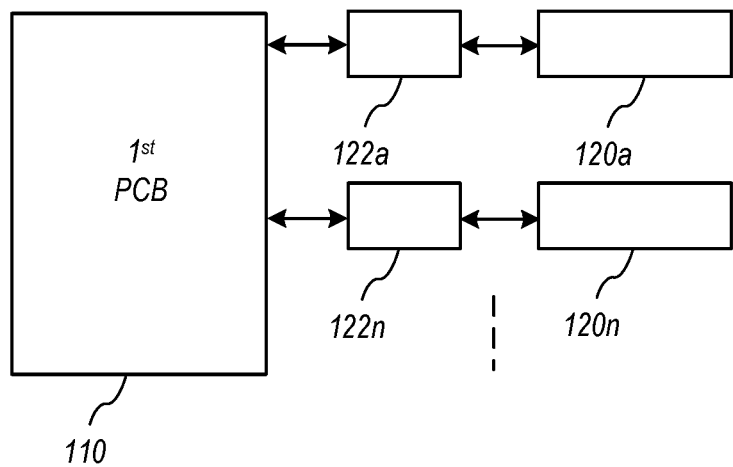
FIG. 1 depicts a simplified block diagram of a first circuit board coupled to multiple secondary devices via respective conductive alignment devices, according to some embodiments.

While the present disclosure is subject to various modifications and alternative forms, specific embodiments thereof have been shown by way of example in the drawings and will herein be described in detail. The present disclosure should be understood to not be limited to the particular forms disclosed, but on the contrary, the intention is to cover all modifications, equivalents, and alternatives falling within the spirit and scope of the present disclosure.

DETAILED DESCRIPTION

Apparatus and methods for aligning devices for LIDAR systems are disclosed. It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details.

Measurements, sizes, amounts, etc. may be presented herein in a range format. The description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as 10-20 inches should be considered to have specifically disclosed subranges such as 10-11 inches, 10-12 inches, 10-13 inches, 10-14 inches, 11-12 inches, 11-13 inches, etc.

When the specification makes reference to "one embodiment" or to "an embodiment" it is intended mean that a particular feature, structure, characteristic, or function described in connection with the embodiment being discussed is included in at least one contemplated embodiment. Thus, the appearance of the phrase, "in one embodiment," in different places in the specification does not constitute a plurality of references to a single embodiment.

Furthermore, connections between components or systems within the figures are not intended to be limited to direct connections. Rather, data or signals between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Motivation for and Benefits of Some Embodiments

An important process in building a LIDAR system is properly aligning each transmitter (e.g., laser) with one or more corresponding receivers (e.g., optical detectors). In some examples, this alignment process includes a first step of aligning each optical module before mechanically securing the modules to printed circuit boards. In one example, a laser module is aligned to a corresponding detector before being mechanically secured to a circuit board. Once proper alignment is achieved, the laser module is secured to the circuit board using an epoxy that fastens the module in place to help maintain alignment during use. This alignment process can be very time-consuming because it is performed before securing each module to an associated circuit board. If a large array of lasers and detectors are deployed within a LIDAR system, this alignment procedure can be even more burdensome. It is highly desirable that the installations of these optical modules (which may be embodied in or mounted on multiple thin secondary circuit boards) are time efficient, convenient for fine alignment, and mechanically robust to withstand vibration or shocks during deployed operation.

Accordingly, what is needed are systems and methods that facilitate more efficient and less time-consuming techniques for alignment of laser and detector modules within a LIDAR system.

Particular embodiments of the apparatus and methods disclosed herein can be implemented so as to realize one or more of the following advantages. Some embodiments facilitate the mechanical and electrical coupling of secondary devices to circuit boards prior to adjusting the alignment of the secondary devices with respect to each other, which can result in faster and more accurate assembly of electronic devices. Other advantages of the disclosed subject matter will become apparent from the description, the drawings, and the claims.

Some Techniques for Aligning Devices for LIDAR Systems

FIG. 1 depicts a simplified block diagram of a first circuit board 110 coupled to multiple secondary devices 120a-120n (e.g., packages, circuit boards, submounted devices, etc.) via respective conductive alignment devices 122a-122n. In one or more embodiments, the first circuit board 110 may be a mainboard of a LIDAR apparatus and each of the secondary devices 120a-120n may include an optical emitter or optical detector supported by the mainboard. The optical emitters or detectors may be mounted on respective thin circuit boards or submounts allowing for installation on a motherboard to enable a compact configuration. Before operation, optical emitters or detectors may be aligned in desired directions for enhanced (e.g., optimized) performance. The alignment step may make use of electrical connections between the secondary devices 120a-120n and the first circuit board 110. After the alignment is performed, the conductive alignment devices 122a-122n may hold the secondary devices 120a-120n in the aligned position steadily. In some embodiments, the conductive alignment devices may facilitate installations of those multiple thin devices that are time efficient, convenient for fine alignment and mechanically robust to withstand vibration or shocks during deployed operation.

Figure 2:
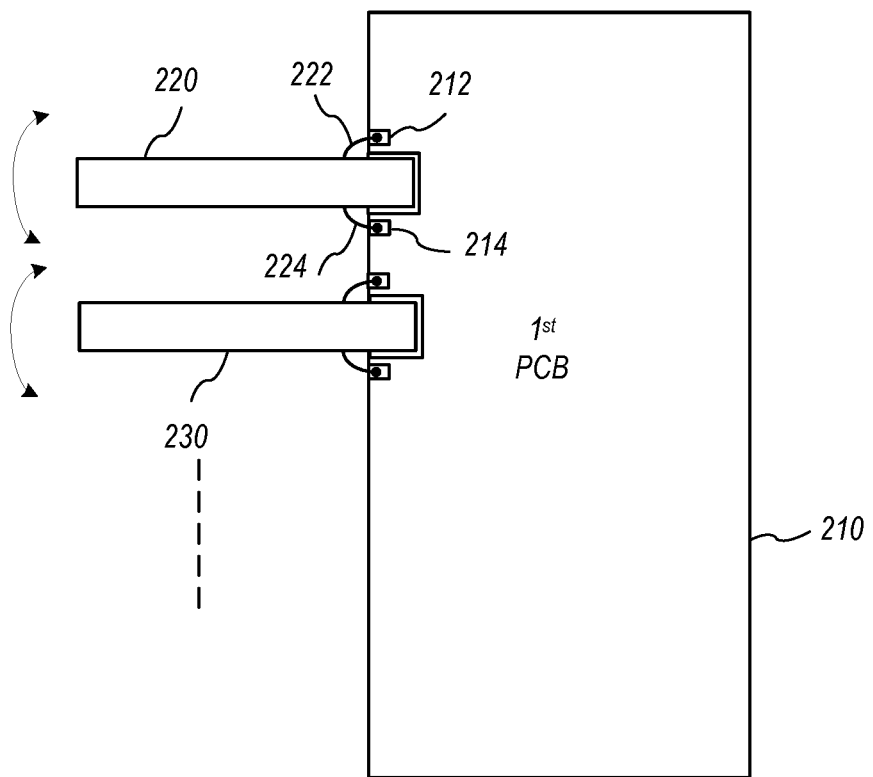
FIG. 2 depicts a side view of a first circuit board coupled to multiple secondary devices, according to an example.

To highlight the improvement to the alignment process using the conductive alignment devices, FIG. 2 is a side view of a first circuit board 210 coupled to secondary circuit boards 220, 230 using an alternative coupling method. In the example of FIG. 2, the secondary circuit board 220 is electrically connected to the first circuit board 210 via multiple flexible wires 222, 224, soldered to respective pins 212, 214, etc. such that the secondary circuit board 220 may be powered up for alignment. Once the alignment is done, the secondary circuit board 220 is held at the aligned position and glued to the first circuit board 210 for a solid mechanical connection. The glue may need a UV curing process to secure a solid mechanical connection. Once the glue is cured, the secondary circuit board is fixed in the aligned position and further adjustment is impractical or impossible.

Such a process is time consuming, partially due to the UV curing time required for the glue, and thus lowers the alignment efficiency for LIDAR device deployment. Furthermore, once the glue is cured, the mechanical connection is fixed. Therefore, the LIDAR device is not able to undergo a re-alignment or recalibration process.

To overcome the above issues, embodiments of new coupling devices disclosed herein may provide for improvements in assembly efficiency, performance and serviceability.

Figure 3:
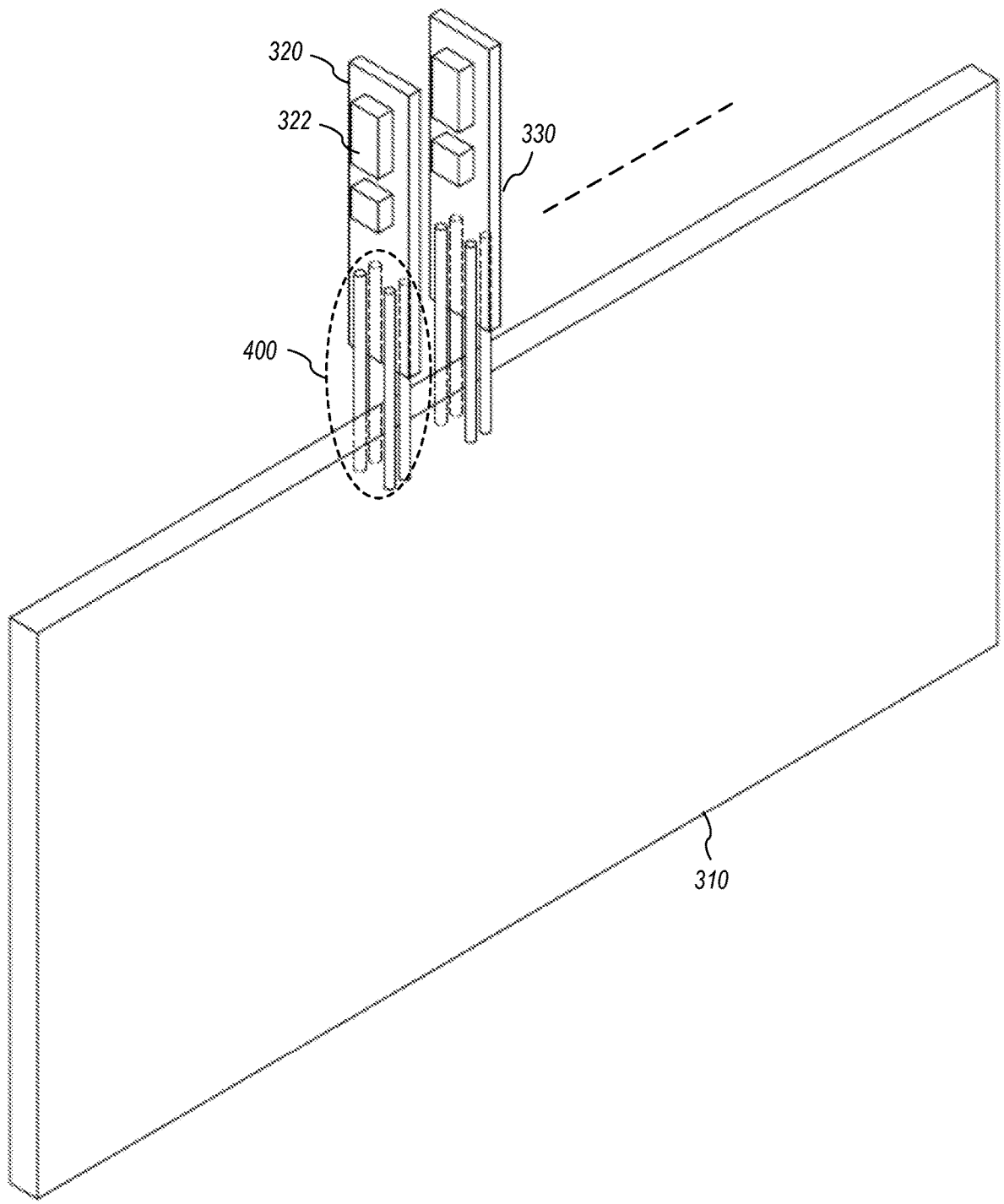
FIG. 3 depicts a perspective view of a first circuit board coupled to multiple secondary circuit boards, according to one or more embodiments.
Figure 4:
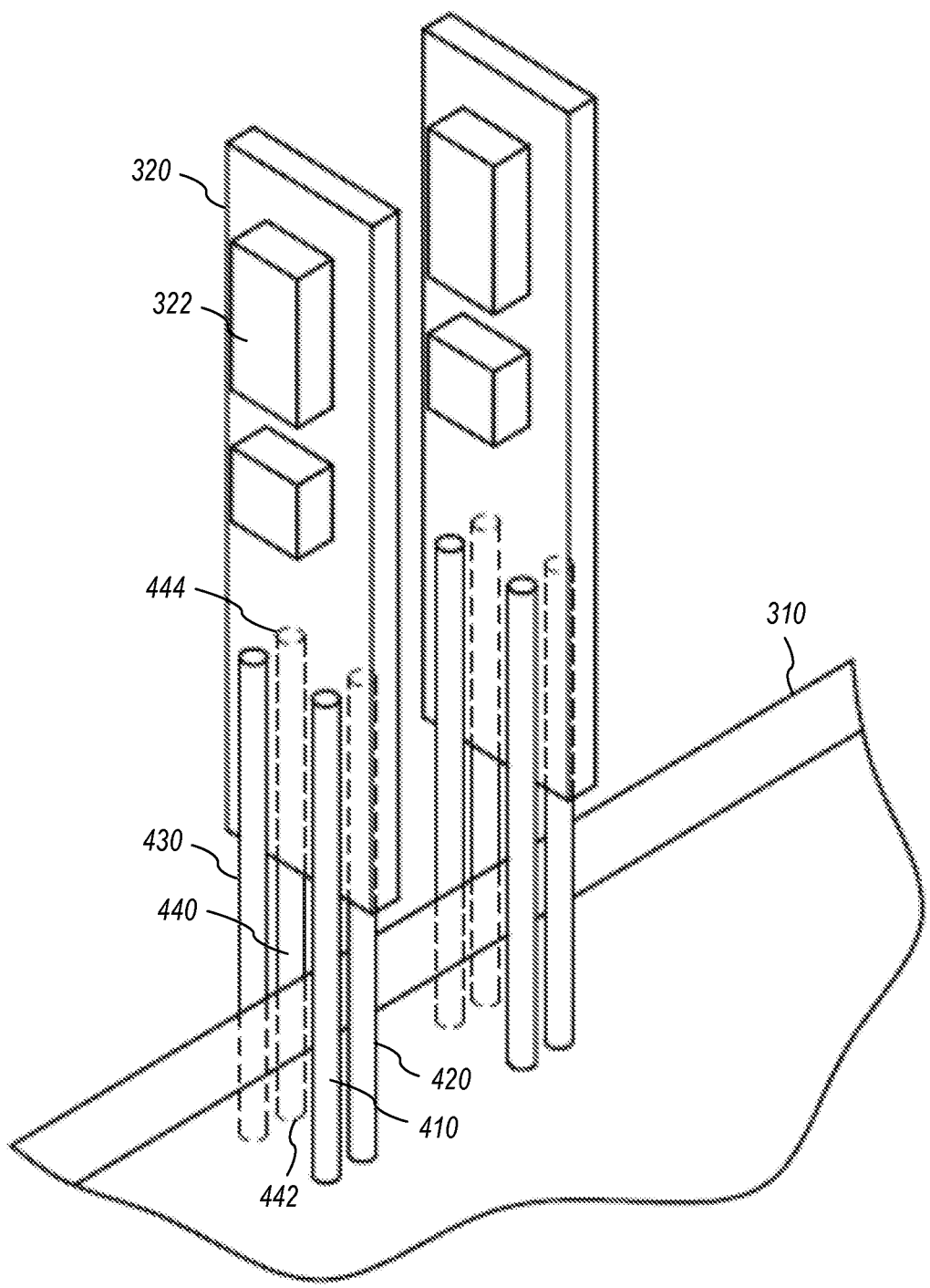
FIG. 4 depicts an enlarged perspective view of the conductive alignment devices between the first circuit board and the respective secondary circuit boards, according to one or more embodiments.
Figure 5:
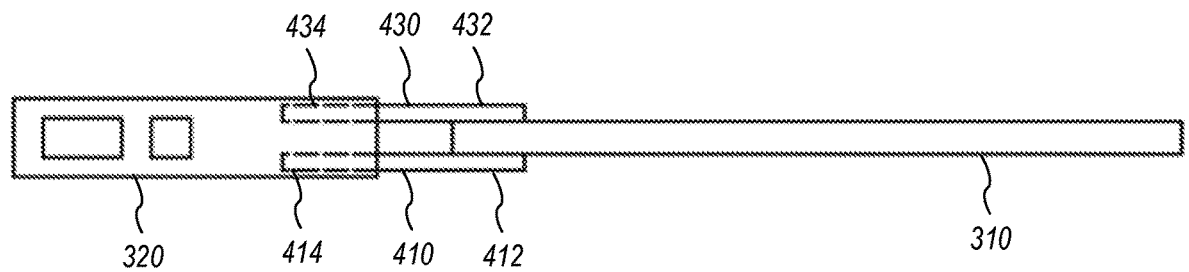
FIG. 5 depicts a side view of the conductive alignment device between the first circuit board and one of the secondary circuit boards, according to one or more embodiments.
Figure 6:
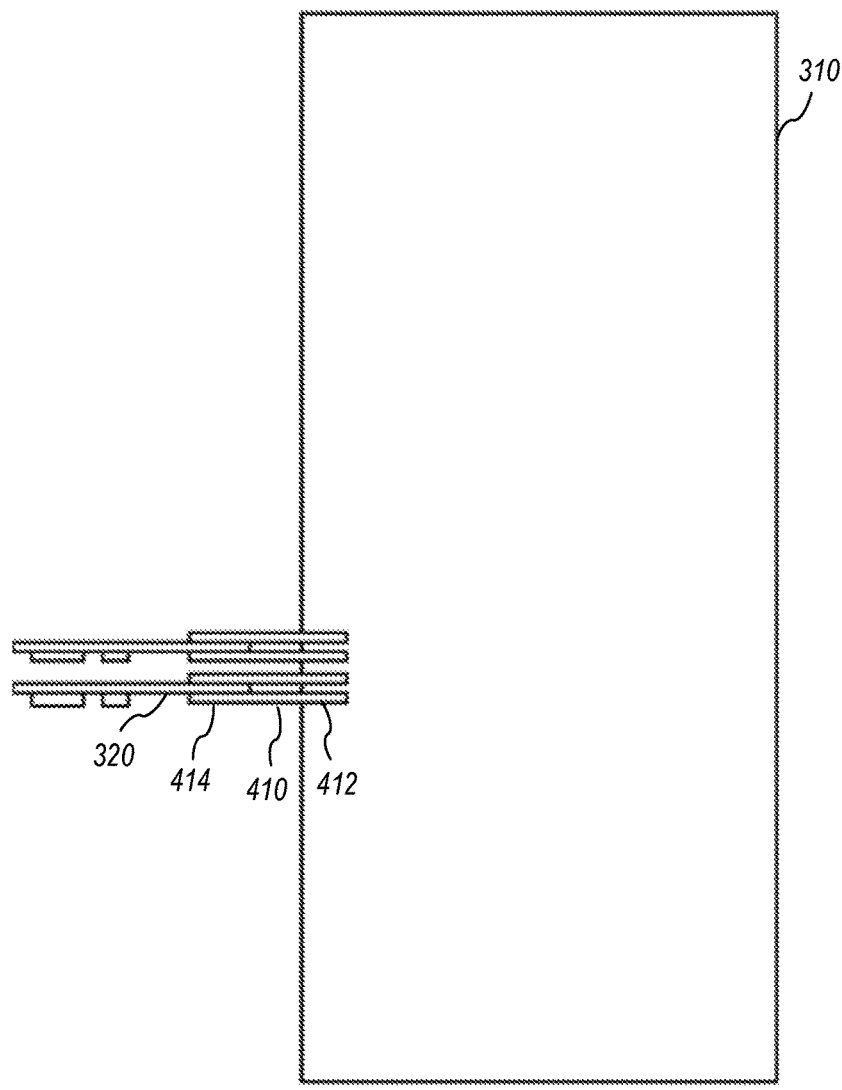
FIG. 6 depicts a front view of the conductive alignments device between the first circuit board and the respective secondary circuit boards, according to one or more embodiments.

FIG. 3 is a perspective view of a first circuit board 310 coupled to multiple secondary circuit boards 320, 330, etc., according to one or more embodiments. FIGS. 4-6 depict an enlarged perspective view, a side view and a front view respectively of some embodiments of the conductive alignment devices between the first circuit board and multiple secondary circuit boards corresponding to the configuration of FIG. 3. In one or more embodiments, each of the secondary circuit boards may include an optical component 322 (e.g., an optical emitter including laser diode for photo transmission, or an optical detector including a photodiode for optical detection).

As shown in FIGS. 3-6, the secondary circuit board 320 couples to the first circuit board 310 via a conductive alignment device 400 comprising a plurality of discrete conductive elements (e.g., "rods") 410, 420, 430, and 440 that provide both mechanical connection and electrical connection between the two circuit boards. The conductive alignment device 400 may include any suitable number of discrete conductive elements, for example, between two and eight (e.g., four) conductive elements. In some embodiments, the elements 410, 420, 430, and 440 are substantially parallel to each other but may have various relative positions, which may be determined based on the alignment process. Each element has a first end (412, 422, 432 or 442) electrically connected to the first board and a second end (414, 424, 434 or 444) electrically connected to the secondary board. The electrical connection between a conductive element and a circuit board may be secured (e.g., permanently secured) by soldering the element to a pin on the circuit board (e.g., first or secondary circuit board). In one or more embodiments, the length of each element is predetermined such that there is a gap between the secondary circuit board and the first circuit board to leave space for maneuvering the secondary circuit boards during the alignment process to align pairs of optical components on adjacent secondary circuit boards.

In one or more embodiments, each of the conductive elements comprises a semi-rigid metal or metal alloy rod (e.g., a semi-rigid metal or metal alloy cable) that provides a solid electrical connection (e.g., a reliable electrical connection suitable for use in an electrical circuit) between the first circuit board and the secondary circuit board. In certain embodiments, a rod of a conductive element comprises at least 75% tin and up to 25% other metal(s) (e.g., copper, lead, etc.). In one specific embodiment, a rod of a conductive element comprises at least 99% tin and up to 1% other metal(s) (e.g., copper, lead, etc.). The rod of a conductive element may have any suitable shape including, without limitation, a cylindrical shape, rectangular shape or any other shape that permits the conductive elements to provide a semi-rigid connection as described within the specification. In certain examples, the rod is cylindrical in shape and has a diameter between 0.25 mm and 0.75 mm. In one specific embodiment, the rod is approximately 0.5 mm in diameter. The conductive elements may be formable or pliable under mechanical stress applied above a threshold stress level and be able to keep the form after the mechanical force is withdrawn while mechanical stress remains below the threshold stress level. In one or more embodiments, the conductive elements may be made from one or more soft metal elements, for example, tin, silver, copper etc. The semi-rigidity of the conductive elements enables the secondary circuit board first to be solidly and electrically connected to the first circuit board, and then to be precisely aligned at a desired position or angle after the solid electrical connection is established. This configuration greatly simplifies the assembly and alignment process for a LIDAR device.

In some embodiments, during manufacturing of a device comprising a primary circuit board and one or more secondary circuit boards, the semi-rigid rods are bent to align optical transmitters and/or detectors. After the rods are bent, they maintain their electrical connections between the primary and secondary circuit boards, and stay physically in place within the alignment tolerances of the optical components.

Additionally, benefits of the semi-rigid conductive alignment device may further include but are not limited to:

consistency of secondary circuit board position between channels; the ability to "realign/rework" units downstream which drastically reduces scrap costs and rework time; the ability to "tune-up" the device (e.g., realign the secondary circuit boards) whenever and wherever needed; improved serviceability and performance for the LIDAR device; elimination of the unpredictability involved with adhesives and UV curing; and/or a reduction in the amount of manufacturing tooling/equipment needed for manufacturing; etc.

In one or more embodiments, the first circuit board is sandwiched between first ends of the rods of the elements of a conductive alignment device, with the first end of at least one rod disposed on a first side of the first circuit board and the first end of at least one other rod disposed on a second, opposing side of the first circuit board. For example, the conductive alignment device may include four conductive elements, with the first ends of two rods disposed on the first side of the first circuit board and the first ends of two rods disposed on the second, opposing side of the first circuit board. An example of this configuration is shown in FIG. 4. Each of the first ends of the connective elements may be connected to its side of the first circuit board by a respective soldering point.

Similarly, for balanced mechanical connection, the secondary circuit board may be sandwiched between second ends of the rods of the elements of a conductive alignment device, with the second end of at least one rod disposed on a first side of the secondary circuit board and the second end of at least one other rod disposed on a second, opposing side of the secondary circuit board. For example, the conductive alignment device may include four conductive elements, with the seconds ends of two rods disposed on the first side of the secondary circuit board and the second ends of two rods disposed on the second, opposing side of the secondary circuit board. An example of this configuration is shown in FIG. 4. Each of the second ends of the connective elements may be connected to its side of the secondary circuit board by a respective soldering point.

Other configurations are possible. For example, a pair of conductive elements may have their first ends connected to the same side of the first circuit board 310 and their second ends connected to opposing sides of the secondary circuit board 320. Alternatively, a pair of conductive elements may have their first ends connected to opposing sides of the first circuit board 310 and their second ends connected to the same side of the secondary circuit board 320.

In one or more embodiments, the multiple conductive elements of a conductive alignment device provide at least two isolated electrical paths for a closed electrical connection between the first circuit board and the secondary circuit board. In one or more embodiments, one or more connection pins on the first circuit board (and/or one or more conductive elements of a conductive alignment device) are used for mechanical support only instead of establishing an electrical path. In one or more embodiments, all the conductive elements of the conductive alignment device 400 are used to establish one or more electrical paths between the first circuit board and a secondary circuit board.

In one or more embodiments, the multiple conductive elements of a conductive alignment device may be arranged such that, for each conductive element, the side of the first circuit board on which the first end of the conductive element is disposed and the side of the secondary circuit board on which the second end of the conductive element is disposed are substantially perpendicular to each other. Such a configuration is illustrated, for example, in FIG. 4. This configuration facilitates a compact arrangement of multiple secondary circuit boards attached to the first circuit board by respective conductive alignment devices. The multiple secondary boards may be aligned individually or collectively in one or two dimensions for desired slants and tilts.

Figure 7:
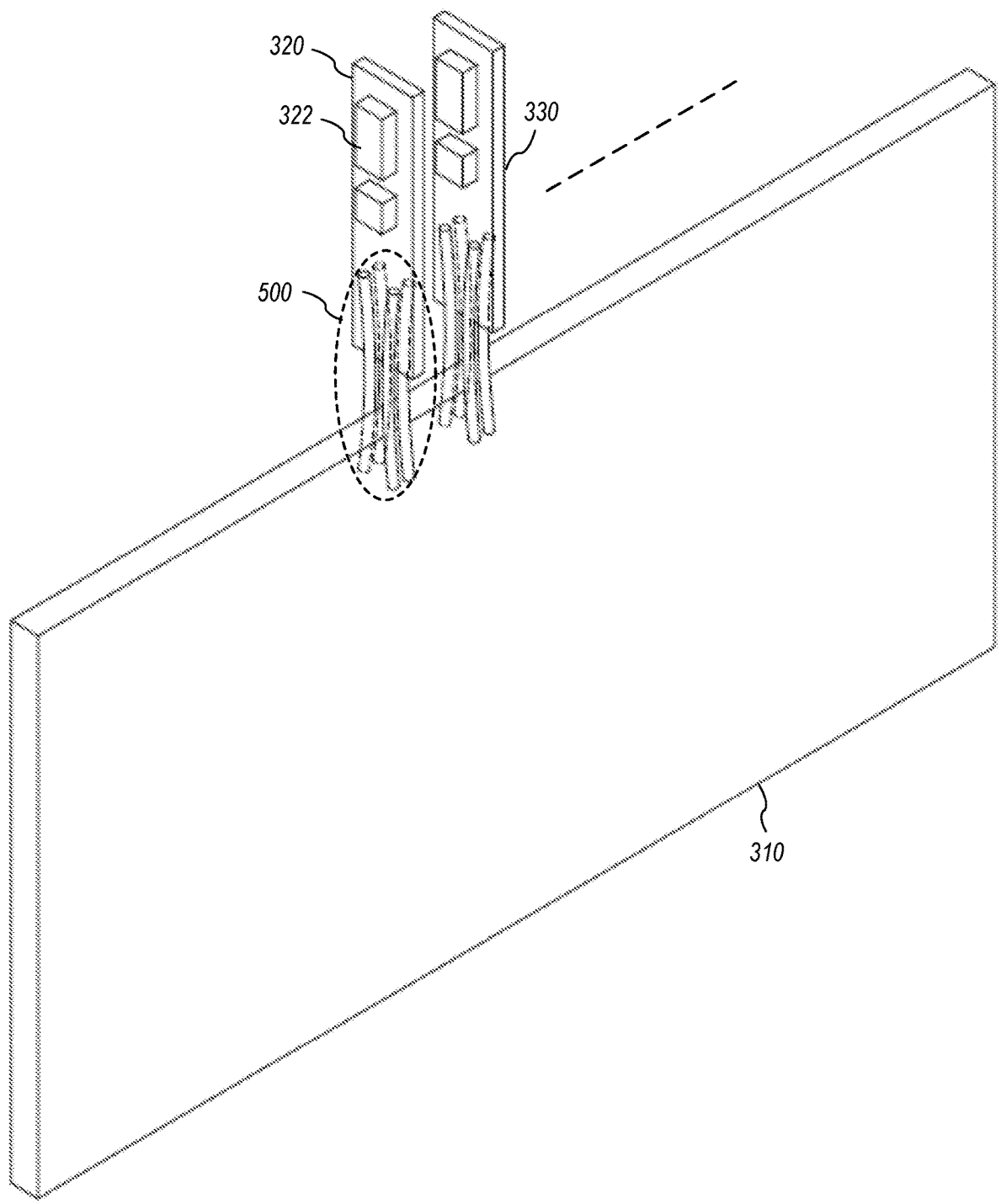
FIG. 7 depicts a perspective view of a first circuit board coupled to multiple secondary circuit boards, according to one or more additional embodiments of the invention.
Figure 8A:
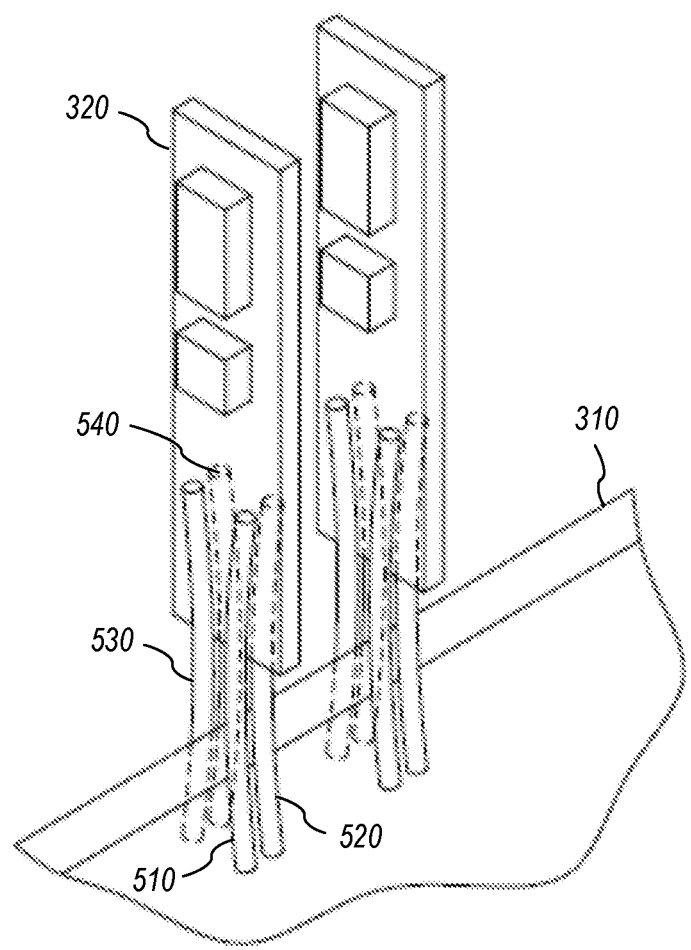
FIG. 8A depicts an enlarged perspective view of second conductive alignment devices between the first circuit board and the respective secondary circuit boards, according to the additional embodiments.
Figure 8B:
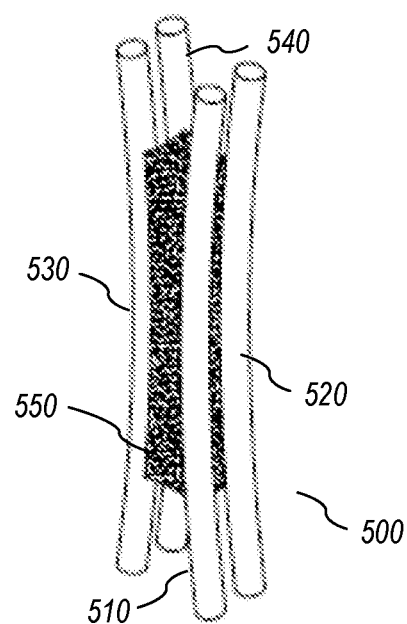
FIG. 8B depicts a perspective view of the second conductive alignment device with a main body and multiple elements, according to some embodiments.

FIG. 7 and FIG. 8A depict a perspective view and an enlarged view of a first circuit board 310 coupled to multiple secondary circuit boards 320, 330, etc., according to one or more embodiments. FIG. 8B depicts a perspective view of another embodiment of a conductive alignment device 500 without the circuit boards for a clean structure view. Similar to the first embodiment of the coupling device 400, the second embodiment of the coupling device 500 comprises a plurality of discrete conductive elements (e.g., "rods") 510, 520, 530, and 540 that provide both mechanical connection and electrical connection between two circuit boards. The conductive alignment device 500 may include any suitable number of discrete conductive elements, for example, between two and eight (e.g., four) conductive elements. Each conductive element has a first end electrically connected to the first board and a second end electrically connected to the secondary board. The electrical connection between a conductive element and a circuit board may be secured (e.g., permanently secured) by soldering the element to a pin on the circuit board (e.g., first or secondary circuit board).

In one or more embodiments, the multiple conductive elements of a conductive alignment device 500 provide two or more isolated electrical paths between the first circuit board and the secondary circuit board. In one or more embodiments, one or more connection pins on the first circuit board (and/or one or more conductive elements of a conductive alignment device) are used for mechanical support only instead of establishing an electrical path. In one or more embodiments, all the conductive elements of the conductive alignment device 500 are used to establish one or more electrical paths between the first circuit board and a secondary circuit board.

When the conductive elements of a conductive alignment device (400, 500) provide one or more electrical paths between a first circuit board and a secondary circuit board, those electrical paths may be used by the circuit boards to send and receive electrical signals (e.g., electrical signals encoding messages). For example, the primary circuit board may use the conductive elements to send signals to an optical device on a secondary circuit board (e.g., to configure and/or control the operation of the optical device) and/or to receive signals from the optical device (e.g., signals indicating properties of optical signals received by the optical device or properties of the optical device's environment, including but not limited to range to a reflective target, reflectance of a reflective target, optical signal intensity, etc.)

Different from some configurations of the conductive elements in the first embodiment of the conductive alignment device 400, the conductive elements 510, 520, 530, and 540 of the second embodiment of the conductive alignment device 500 are not substantially parallel to each other. Instead, as can be seen in FIGS. 7-8B, the conductive elements are curved inwardly (e.g., the middle portions of selected pairs of the conductive elements are nearer to each other than are the first ends and/or the second ends of the same pair of conductive elements) for an improved mechanical support. In some configurations, the pair(s) of conductive elements that curve inwardly with respect to each other may have their first ends connected to opposing sides of the first circuit board 310 and their second ends connected to the same side of the secondary circuit board 320. Examples of such pairs of conductive elements are shown in FIG. 8A (e.g., conductive elements 510 and 530, or conductive elements 520 and 540). Other configurations are possible. For example, a pair of conductive elements that curve inwardly with respect to each other may have their first ends connected to the same side of the first circuit board 310 and their second ends connected to opposing sides of the secondary circuit board 320. Alternatively, a pair of conductive elements that curve inwardly with respect to each other may have their first ends connected to opposing sides of the first circuit board 310 and their second ends connected to opposing sides of the secondary circuit board 320. Furthermore, a filling 550 may be disposed within an interior space defined by the conductive elements of the conductive alignment device. In one or more embodiments, the filling 550 is elastic or semi-elastic to further enhance the mechanical strength of the conductive alignment device and/or to help absorb vibration or shock during deployed operation.

Although both the first embodiment of the conductive alignment device 400 and second embodiment of the conductive alignment device 500 are shown to have 4 conductive elements for balanced coupling, one skilled in the art shall recognize that other numbers of conductive elements (e.g., 2-8) may be used for coupling. In some embodiments, the conductive elements may have outward curvatures instead of inward (e.g., the middle portions of selected pairs of the conductive elements may be farther from each other than are the first ends and/or the second ends of the same pair of conductive elements). All of such variations fall within the scope of some embodiments of the conductive alignment device.

Figure 9:
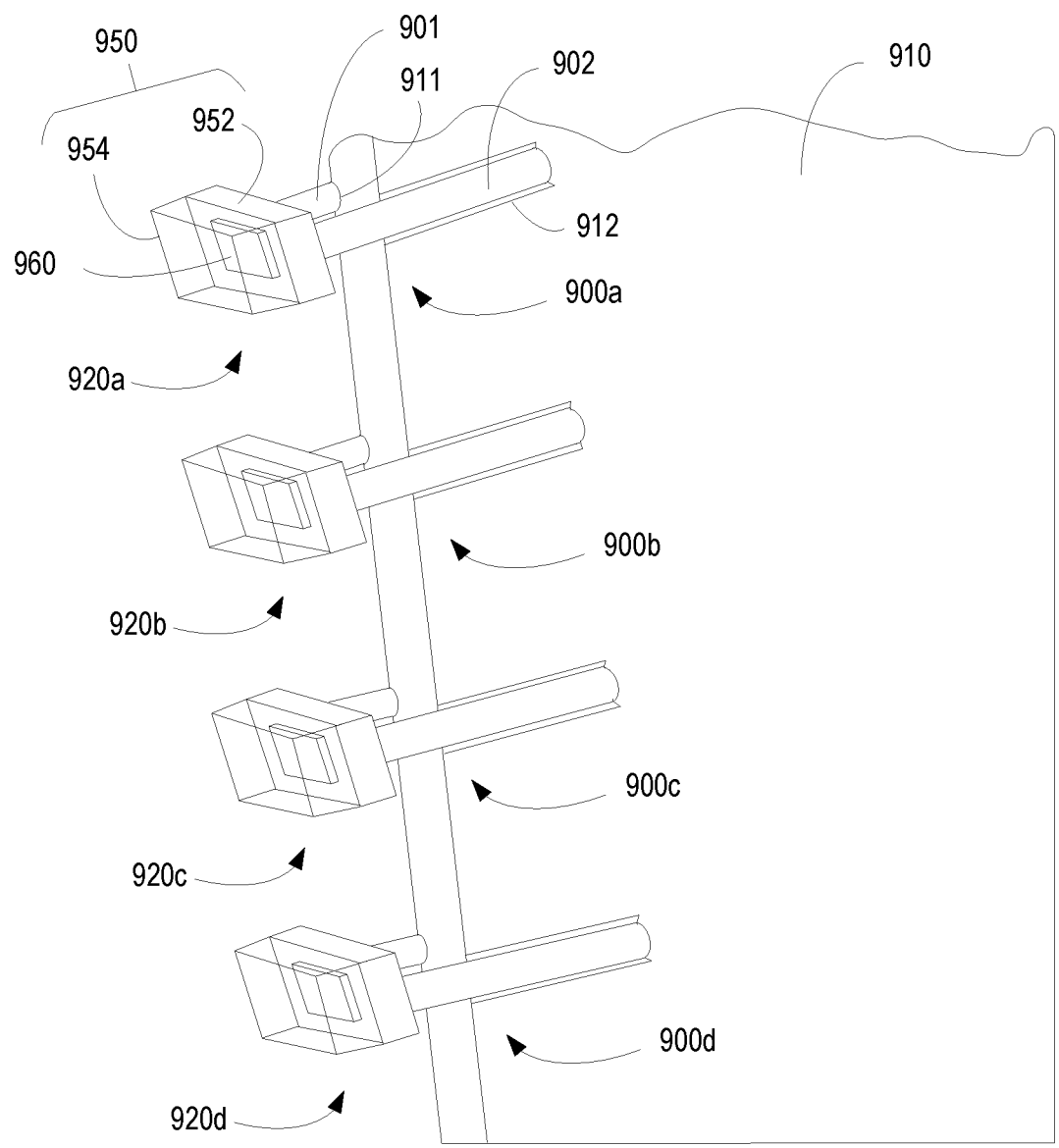
FIG. 9 depicts a perspective view of a first circuit board coupled to multiple secondary submounted devices, according to one or more embodiments.

Examples have been described in which conductive alignment devices (400, 500) are used to couple secondary circuit boards to a primary circuit board. In some embodiments, conductive alignment devices are used to couple other secondary devices (e.g., secondary packages, secondary submounted devices, etc.) to a primary circuit board. FIG. 9 is a perspective view of a first circuit board 910 coupled to multiple secondary submounted devices 920a-920d by respective conductive alignment devices 900a-900d, according to one or more embodiments. In one or more embodiments, each of the secondary devices 920 may include a submount 950 and a mounted component 960. Some embodiments of the submount and mounted component are described in further detail below.

Any suitable submount 950 may be used. In some embodiments, the submount 950 includes a substrate 952 and (optionally) a protective cap 954. The substrate 952 may comprise any suitable layer of material that provides mechanical support for the mounted component 960. Via holes may be formed in the substrate 952, and these via holes can be plated and/or filled with conductive material (e.g., copper or aluminum) to form vias. Contact pads that electrically connect to the vias can be formed on opposite sides of the substrate 952, for example by plating and patterning metal traces. In this manner, electrically conductive paths can be formed from one side of the substrate 952 to the other. The submount 950 may also include features that provide electrical connections (e.g., die attach pads, electrical traces, etc.), features that dissipate thermal energy, features that provide optical functionality (e.g., reflectors and/or lenses), and/or features that provide other functionality.

The protective cap 954 may protect the mounted component 960 from environmental damage (e.g., oxidation, contamination from dust and/or moisture, etc.). In some embodiments, the protective cap hermetically seals the mounted component 960 and the top surface of the substrate 952. In some embodiments, the protective cap 954 is a layer of material formed over the mounted component 960 and the substrate 952. In some embodiments, the protective cap is formed separately from the substrate and joined (e.g., sealed) to the substrate after the component 960 is mounted. The protective cap 954 may be formed from any suitable material that protects the mounted component and does not interfere with the component's operation (e.g., does not interfere with the transmission and/or detection of optical signals).

Any suitable component 960 (e.g., electronic component, optical component, optoelectronic component, etc.) may be mounted on the substrate 952 of the submount 950. In some embodiments, the mounted component 960 includes an optical emitter including a laser diode for photo transmission and/or an optical detector including a photodiode for optical detection. In some embodiments, the mounted component 960 is electrically coupled to one or more vias formed in the substrate of the submount 950 (e.g., through contact pads formed on a top side of the substrate).

In the example of FIG. 9, the secondary device 920 couples to the first circuit board 910 via a conductive alignment device 900 comprising a plurality of discrete conductive elements (e.g., "rods") 901, 902 that provide both mechanical connection and electrical connection between the secondary device 920 and the first circuit board 910. Some embodiments of conductive alignment devices are described above. In some embodiments, the conductive rods (901, 902) of the conductive alignment device 900 are electrically coupled to the vias of the substrate 952 (e.g., through contact pads formed on a bottom side of the substrate). In the example of FIG. 9, grooves (911, 912) are formed in the first circuit board 910, and the conductive rods of the conductive alignment device 920 can be inserted into the grooves to facilitate the establishment of a stable mechanical connection between the first circuit board 910 and the secondary device 920.

Figure 10:
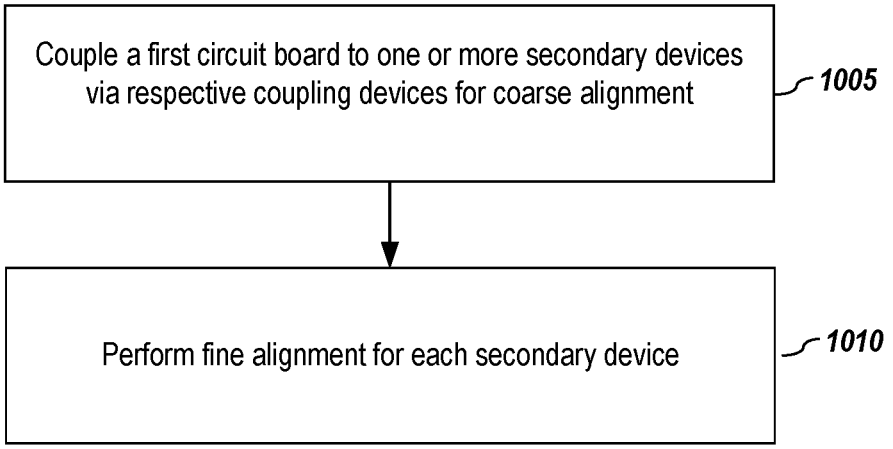
FIG. 10 is a flowchart of a process for coupling and aligning multiple secondary devices at a circuit board level, according to one or more embodiments.

FIGS. 10 and 11 depict methods for coupling and aligning multiple secondary devices, according to one or more embodiments. One of ordinary skill in the art shall recognize that in some embodiments of the disclosed methods: (1), certain steps may be omitted; (2) certain steps may be performed in an order other than the specific order set forth herein; and (3) certain steps may be performed concurrently.

FIG. 10 depicts a method 1000 for coupling and aligning multiple secondary devices at a device level, according to one or more embodiments. In step 1005, a first circuit board is coupled to one or more secondary devices via one or more respective conductive alignment devices for coarse alignment. Each of the conductive alignment devices may be the coupling device 400, 500, 900 or other variations. After all secondary devices are coupled to the first circuit board, the first circuit board and the coupled secondary devices may be finely aligned in step 1010 at a device level such that each secondary device is at a desired position with respect to the first circuit board and with respect to the other secondary devices. In one or more embodiments, the fine alignment may involve applying a predetermined force (e.g., by pushing, pulling, and/or twisting one or more secondary devices and/or the conductive elements of one or more conductive alignment devices) to move one or more secondary devices to the desired aligned positions. Once the predetermined force is withdrawn, the conductive alignment devices are able to hold the one or more secondary devices in the aligned positions due to the aforementioned semi-rigid structure of the conductive alignment device.

In certain situation, an electronic device, for example a LIDAR sensor, may include a block comprising a set of first circuit boards, which may be arranged in a stack configuration. FIG. 11 depicts a method 1100 for coupling and aligning multiple secondary devices at a block level, according to one or more embodiments.

In step 1105, two or more first circuit boards are coupled to respective sets of one or more secondary devices via respective conductive alignment devices for coarse alignment. In step 1110, the two or more circuit boards with their respective sets of coarsely aligned secondary devices are stacked to form a block. The block may be an optical emitter block, an optical detector block, or a combined optical emitter and detector block. In step 1115, the secondary devices are finely aligned with respect to each other and with respect to the first circuit boards, such that each secondary device is at a desired position relative to the first circuit board and the other secondary devices. Similar to process shown in FIG. 10, the fine alignment at the block level may involve applying a predetermined force (e.g., by pushing, pulling, and/or twisting one or more secondary devices and/or the conductive elements of one or more conductive alignment devices) to move one or more secondary devices to the desired aligned positions. Once the predetermined external mechanical force is withdrawn, the conductive alignment devices are able to hold the secondary devices in their aligned positions due to the aforementioned semi-rigid structure of the conductive alignment device.

Further Description of Some Embodiments

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. Other steps or stages may be provided, or steps or stages may be eliminated, from the described processes. Accordingly, other implementations are within the scope of the following claims.

Terminology

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An electronic device comprising:
a secondary device; and
a coupling device coupled to the secondary device,
wherein the coupling device comprises a plurality of conductive members, including at least a first conductive member and a second conductive member,
wherein each of the conductive members comprises a first end configured to electrically and mechanically couple to a primary circuit board and a second end electrically and mechanically coupled to the secondary device,
wherein the first end of the first conductive member is coupled to a first side of the primary circuit board, and the first end of the second conductive member is coupled to a second side of the primary circuit board, the second side of the primary circuit board being opposite to the first side of the primary circuit board, and
wherein each of the plurality of conductive members has an attribute adjustable in response to a condition being added to the respective conductive member, and is configured to maintain the adjusted attribute after the condition is removed.

2. The electronic device of claim 1, wherein each conductive member in the plurality of conductive members comprises a respective semi-rigid rod.

3. The electronic device of claim 1, wherein the attribute comprises a spatial attribute.

4. The electronic device of claim 1, wherein the attribute of the respective conductive member comprises a shape and/or an orientation of the respective conductive member, and wherein the condition being added to the respective conductive member comprises a force above a threshold level being applied to the respective conductive member.

5. The electronic device of claim 1, further comprising the primary circuit board.

6. The electronic device of claim 5, wherein the plurality of conductive members provide at least two electrical paths between the primary circuit board and the secondary device.

7. The electronic device of claim 5, wherein the secondary device comprises an optical transmitter or an optical receiver.

8. The electronic device of claim 5, further comprising a plurality of secondary devices including the secondary device, wherein each of the secondary devices comprises a respective optical transmitter or a respective optical receiver.

9. The electronic device of claim 1, wherein the coupling device further comprises an elastic filling between the first conductive member and the second conductive member.

10. The electronic device of claim 1, wherein the second end of the first conductive member is coupled to a first side of the secondary device, and the second end of the second conductive member is coupled to a second side of the secondary device, the second side of the secondary device being opposite to the first side of the secondary device.

11. The electronic device of claim 1, wherein the plurality of conductive members exert forces on the secondary device to maintain a stable position and a stable orientation of the secondary device relative to the primary circuit board.

12. The electronic device of claim 11, wherein the stable position and the stable orientation of the secondary device relative to the primary circuit board are determined based on a plurality of properties of the conductive members, including:
locations of respective areas on the secondary device proximate to the respective second ends of the conductive members,
locations of respective areas on the primary circuit board proximate to the respective first ends of the conductive members, and
respective lengths, shapes, and orientations of the conductive members.

13. The electronic device of claim 11, wherein the respective attributes of the plurality of conductive members are adjustable to change the stable position and the stable orientation of the secondary device relative to the primary circuit board.

14. The electronic device of claim 11, wherein the plurality of conductive members maintain a gap region between an end of the secondary device and an adjacent end of the primary circuit board oriented in a plane substantially parallel to a plane of the end of the secondary device, and wherein the plurality of conductive members extend across the gap region.

15. The electronic device of claim 1, wherein the secondary device comprises an optical component mounted on a secondary circuit board or on a submount.

16. An alignment method, comprising:
coupling a plurality of secondary devices to a primary circuit board via a respective plurality of coupling devices,
wherein each of the coupling devices comprises a respective plurality of conductive members,
wherein coupling the secondary devices to the primary circuit board comprises electrically and mechanically coupling each of the secondary devices to the primary circuit board through the respective plurality of conductive members of the respective coupling device, wherein electrically and mechanically coupling a particular secondary device of the plurality of the secondary devices to the primary circuit board comprises coupling a first end of a first conductive member of the respective plurality of conductive members of the particular secondary device to a first side of the primary circuit board, and coupling a first end of a second conductive member of the respective plurality of conductive members of the particular secondary device to a second side of the primary circuit board, the second side of the primary circuit board being opposite to the first side of the primary circuit board; and
after coupling the secondary devices to the primary circuit board, aligning each of the secondary devices with respect to the primary circuit board and with respect to one or more of the secondary devices while maintaining the electrical and mechanical coupling between the primary circuit board and each of the secondary devices.

17. The alignment method of claim 16, wherein each conductive member in each plurality of conductive members comprises a respective semi-rigid rod.

18. The alignment method of claim 16, wherein each secondary device comprises an optical transmitter or an optical receiver.

19. The alignment method of claim 16, wherein the plurality of conductive members maintain a gap region between a plurality of ends of the secondary devices and an adjacent end of the primary circuit board, wherein the gap region is oriented in a plane substantially parallel to a plane of the end of the secondary device, and wherein the plurality of conductive members extend across the gap region.

20. The alignment method of claim 16, wherein:
the respective plurality of conductive members of the respective coupling device of the respective plurality of coupling devices includes of the particular secondary device include at least the first conductive member and the second conductive member.

21. The alignment method of claim 20, wherein the respective plurality of conductive members of the respective coupling device of the particular secondary device provide at least two electrical paths between the primary circuit board and the particular secondary device.

22. The alignment method of claim 20,
wherein a second end of the first conductive member is coupled to a first side of the particular secondary device, and
wherein a second end of the second conductive member is coupled to a second side of the particular secondary device, the second side of the particular secondary device being opposite to the first side of the particular secondary device.

23. The alignment method of claim 22, wherein the respective plurality of conductive members of the respective coupling device of the particular secondary device exert forces on the particular secondary device to maintain a stable position and a stable orientation of the particular secondary device relative to the primary circuit board.

24. The alignment method of claim 23, wherein the stable position and the stable orientation of the particular secondary device relative to the primary circuit board are determined based on a plurality of properties of the conductive members of the respective coupling device of the particular secondary device, including:
locations of respective areas on the particular secondary device proximate to the respective second ends of the conductive members of the respective coupling device of the particular secondary device,
locations of respective areas on the primary circuit board proximate to the respective first ends of the conductive members of the respective coupling device of the particular secondary device, and
respective lengths, shapes, and orientations of the conductive members of the respective coupling device of the particular secondary device.

25. The alignment method of claim 16, wherein aligning each of the secondary devices comprises adjusting a spatial attribute of each of the secondary devices.

* * * * *